(12) United States Patent
Nunan et al.

(10) Patent No.: US 11,097,942 B2
(45) Date of Patent: Aug. 24, 2021

(54) THROUGH SILICON VIA (TSV) FORMATION IN INTEGRATED CIRCUITS

(71) Applicant: Analog Devices, Inc., Norwood, MA (US)

(72) Inventors: Thomas Kieran Nunan, Carlisle, MA (US); Li Chen, Belmont, MA (US)

(73) Assignee: Analog Devices, Inc., Wilmington, MA (US)

( * ) Notice: Subject to any disclaimer, the term of this patent is extended or adjusted under 35 U.S.C. 154(b) by 287 days.

(21) Appl. No.: 15/334,619

(22) Filed: Oct. 26, 2016

(65) Prior Publication Data
US 2018/0111823 A1 Apr. 26, 2018

(51) Int. Cl.
B81B 7/00 (2006.01)
B81C 1/00 (2006.01)
(Continued)

(52) U.S. Cl.
CPC ........ B81B 7/0006 (2013.01); B81C 1/00238 (2013.01); B81C 3/001 (2013.01); H01L 21/76898 (2013.01); H01L 23/481 (2013.01); B81B 2201/0228 (2013.01); B81B 2201/0235 (2013.01); B81B 2201/0242 (2013.01); B81B 2201/0264 (2013.01); B81B 2203/0315 (2013.01); B81B 2207/012 (2013.01); B81B 2207/07 (2013.01); B81B 2207/096 (2013.01);
(Continued)

(58) Field of Classification Search
CPC ............ H01L 21/76898; H01L 23/481; H01L 2224/14181; B81B 7/0006; B81B 2203/0315; B81B 2207/012; B81B 2207/07; B81B 2201/0228; B81B 2201/0235; B81B 7/007; B81C 3/001; B81C 2203/036; B81C 1/00238

See application file for complete search history.

(56) References Cited

U.S. PATENT DOCUMENTS 7,939,941 B2 5/2011 Chiou et al.
8,084,332 B2 * 12/2011 Nasiri ................. B81C 1/00269
438/456
(Continued)

FOREIGN PATENT DOCUMENTS

CN 102583219 A 7/2012
CN 103050436 A 4/2013
(Continued)

Primary Examiner — Charles D Garber
Assistant Examiner — S M Sohel Imtiaz
(74) Attorney, Agent, or Firm — Wolf, Greenfield & Sacks, P.C.

(57) ABSTRACT

Integrated circuit substrates having through silicon vias (TSVs) are described. The TSVs are vias extending through the silicon substrate in which the integrated circuitry is formed. The TSVs may be formed prior to formation of the integrated circuitry on the integrated circuit substrate, allowing the use of via materials which can be fabricated at relatively small sizes. The integrated circuit substrates may be bonded with a substrate having a microelectromechanical systems (MEMS) device. In some such situations, the circuitry of the integrated circuit substrate may face away from the MEMS substrate since the TSVs may provide electrical connection from the circuitry side of the integrated circuit substrate to the MEMS device.

18 Claims, 14 Drawing Sheets

(51) Int. Cl.
   *B81C 3/00* (2006.01)
   *H01L 21/768* (2006.01)
   *H01L 23/48* (2006.01)

(52) U.S. Cl.
   CPC .. *B81C 2203/036* (2013.01); *B81C 2203/037* (2013.01); *B81C 2203/0792* (2013.01)

(56) References Cited

U.S. PATENT DOCUMENTS

| | | |
|---|---|---|
| 8,158,456 B2 | 4/2012 | Chen et al. |
| 8,525,278 B2 | 9/2013 | Chu et al. |
| 8,987,137 B2 | 3/2015 | Bachman et al. |
| 9,018,094 B2 | 4/2015 | Kosenko et al. |
| 9,209,157 B2 | 12/2015 | Chiou et al. |
| 2002/0043691 A1* | 4/2002 | Higashi ............... H01L 29/4908 257/368 |
| 2010/0032809 A1* | 2/2010 | Collins ................ H01L 23/481 257/621 |
| 2011/0177655 A1 | 7/2011 | Chiou et al. |
| 2012/0024713 A1 | 2/2012 | Preisser |
| 2012/0148187 A1* | 6/2012 | Barowski ............... G02B 6/43 385/14 |
| 2012/0273940 A1* | 11/2012 | Jo ....................... H01L 23/3128 257/737 |
| 2012/0282735 A1* | 11/2012 | Ahn ................... H01L 21/6835 438/109 |
| 2013/0043547 A1* | 2/2013 | Chu ........................ H01L 24/81 257/415 |
| 2013/0210175 A1* | 8/2013 | Hoisington ........... B41J 2/1631 438/21 |
| 2013/0252440 A1 | 9/2013 | Luo et al. |
| 2013/0299950 A1* | 11/2013 | Hummler ........... H01L 23/3677 257/622 |
| 2014/0070339 A1* | 3/2014 | Marx ................... B81B 7/0041 257/415 |
| 2014/0239979 A1* | 8/2014 | Wygant .................. B81B 7/007 324/658 |
| 2014/0264653 A1* | 9/2014 | Cheng ................. B81C 1/00238 257/416 |
| 2014/0293751 A1* | 10/2014 | Dekker ............. H01L 23/53271 367/181 |
| 2014/0327150 A1* | 11/2014 | Jung ....................... H01L 24/96 257/774 |
| 2014/0357050 A1* | 12/2014 | Feng ................. H01L 21/76229 438/430 |
| 2015/0076682 A1* | 3/2015 | Wu .................... H01L 21/76898 257/693 |
| 2015/0093880 A1* | 4/2015 | Ji ....................... H01L 21/02013 438/459 |
| 2015/0102437 A1* | 4/2015 | Liu ....................... B81B 3/0021 257/419 |
| 2015/0137323 A1 | 5/2015 | Zhou et al. |
| 2015/0243634 A1* | 8/2015 | Aritome ............... H01L 25/0657 257/774 |
| 2015/0255404 A1* | 9/2015 | Adkisson .......... H01L 23/53238 257/774 |
| 2015/0353348 A1* | 12/2015 | Vandemeer ......... B81C 1/00269 257/415 |
| 2016/0090296 A1* | 3/2016 | Baillin ................ B81C 1/00269 257/774 |
| 2016/0099196 A1 | 4/2016 | Yu et al. |
| 2016/0146850 A1 | 5/2016 | Reinmuth |

FOREIGN PATENT DOCUMENTS

| | | |
|---|---|---|
| CN | 103373695 A | 10/2013 |
| CN | 103922267 A | 7/2014 |
| CN | 104603945 A | 5/2015 |
| CN | 105314592 A | 2/2016 |
| TW | 201216408 A | 4/2012 |
| TW | 201320187 A | 5/2013 |

\* cited by examiner

THROUGH SILICON VIA (TSV) FORMATION IN INTEGRATED CIRCUITS

FIELD OF THE DISCLOSURE

The present application relates to forming through silicon vias (TSVs) on integrated circuit wafers.

BACKGROUND

Through silicon vias are vias which extend through a substrate to provide electrical connection from one side of the substrate to the other. Application specific integrated circuit (ASIC) substrates sometimes include a TSV to provide electrical communication from one side of the substrate to the other. Microelectromechanical systems (MEMS) are sometimes formed on a substrate separate from an ASIC substrate, and then bonded with an ASIC substrate.

SUMMARY OF THE DISCLOSURE

Integrated circuit substrates having through silicon vias (TSVs) are described. The TSVs are vias extending through the silicon substrate in which the integrated circuitry is formed. The TSVs may be formed prior to formation of the integrated circuitry on the integrated circuit substrate, allowing the use of via materials which can be fabricated at relatively small sizes. The integrated circuit substrates may be bonded with a substrate having a microelectromechanical systems (MEMS) device. In some such situations, the circuitry of the integrated circuit substrate may face away from the MEMS substrate since the TSVs may provide electrical connection from the circuitry side of the integrated circuit substrate to the MEMS device.

In certain embodiments, an apparatus is disclosed. The apparatus comprises a microelectromechanical systems (MEMS) substrate. The MEMS substrate includes a MEMS device. The apparatus further comprises an application specific integrated circuit (ASIC) substrate having a device surface, a backside opposite the device surface, an ASIC on the device surface, and a through silicon via (TSV) connecting the device surface to the backside. The MEMS substrate and ASIC substrate are bonded at the backside of the ASIC substrate such that the device surface is distal the MEMS substrate.

In certain embodiments, a method of forming a device including an application specific integrated circuit (ASIC) is disclosed. The method comprises forming a through silicon via (TSV) in a substrate prior to forming any metal features on the substrate and subsequent to forming the TSV in the substrate, forming ASIC components in a device surface of the substrate.

In certain embodiments, a method of forming a device including an application specific integrated circuit is disclosed. The method comprises forming a through silicon via (TSV) in a substrate using at least one processing step at a first temperature greater than 450° C. The method further comprises forming transistors of the application specific integrated circuit using temperatures less than the first temperature.

BRIEF DESCRIPTION OF THE DRAWINGS

Various aspects and embodiments of the application will be described with reference to the following figures. It should be appreciated that the figures are not necessarily drawn to scale. Items appearing in multiple figures are indicated by the same reference number in all the figures in which they appear.

DETAILED DESCRIPTION

Figure 1:
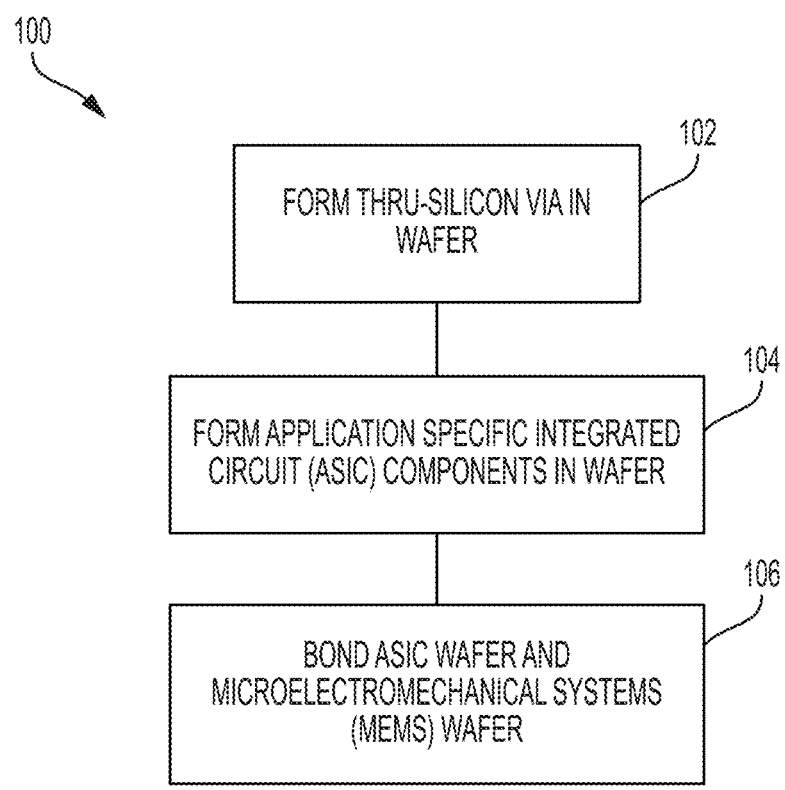
FIG. 1 is a flow chart illustrating a process flow for fabricating an application specific integrated circuit (ASIC) wafer bonded with a microelectromechanical systems (MEMS) wafer, where the ASIC wafer includes a through silicon via.

Aspects of the present application relate to the formation of through silicon vias (TSVs) for application specific integrated circuits (ASICs). The through silicon vias may be formed in the ASIC substrate prior to formation of the integrated circuitry on the ASIC substrate, including prior to any of the metal components of the integrated circuitry being formed. The through silicon vias may be a conductive material capable of withstanding the temperatures used to subsequently process the circuitry components of the ASIC, such as polysilicon. The use of polysilicon as the material of the through silicon vias may facilitate fabrication of relatively narrow through silicon vias, thus conserving space on the ASIC substrate. In some embodiments, the ASIC substrate may be bonded with a substrate having a microelectromechanical systems (MEMS) device, and the circuitry of the ASIC may control and/or sense operation of the MEMS device.

According to an aspect of the present application, a bonded structure including an ASIC substrate bonded with a MEMS substrate is arranged such that the circuitry of the ASIC is on a surface of the ASIC substrate facing away from the MEMS substrate. Electrical communication may be provided between the ASIC and the MEMS device on the MEMS substrate by through silicon vias formed in the ASIC substrate. The through silicon vias may be formed prior to fabrication of the circuitry components of the ASIC on the ASIC substrate and may be formed of a material able to withstand the processing temperatures subsequently used to form the ASIC, such as polysilicon. In some situations, configuring the bonded structure such that the ASIC faces away from the MEMS device improves pressure control of the cavity between the ASIC substrate and the MEMS substrate, because outgassing associated with fabrication of the ASIC is not confined within the cavity but rather directed away from the cavity. Having ASIC circuitry facing outwardly on the surface of the ASIC substrate bonded to the MEMS substrate may additionally provide an advantage in simplifying access to electrical contacts on the ASIC circuitry to perform, for example, electrical measurement or failure analysis.

According to an aspect of the present application, fabrication of through silicon vias on an ASIC substrate, and bonding of the ASIC substrate to a substrate including a MEMS device, may be performed at a stage in which the ASIC substrate and the MEMS device are each part of a respective wafer. The wafers may include multiple instances of the ASIC and of the MEMS device, such that multiple bonded ASIC-MEMS devices may be formed at the same time. Subsequently, the bonded ASIC and MEMS wafers may be cut (diced) or otherwise separated as appropriate to form individual bonded structures, each including an ASIC and a MEMS device. Fabricating the structures at the wafer scale as described may lower production cost and simplify fabrication of individual devices.

The aspects and embodiments described above, as well as additional aspects and embodiments, are described further below. These aspects and/or embodiments may be used individually, all together, or in any combination of two or more, as the application is not limited in this respect.

FIG. 1 is a flowchart showing an exemplary method 100 for forming one or more TSVs in an ASIC wafer prior to formation of the ASIC circuitry, and then bonding the ASIC wafer with a MEMS wafer, according to aspects of the present application. Method 100 comprises: act 102, forming a TSV in a wafer; act 104, forming ASIC components in the wafer; and act 106, bonding the ASIC wafer with a MEMS wafer. Further details are provided below.

As described, act 102 involves forming one or more TSVs in a wafer. The wafer may be a single crystal semiconductor silicon wafer in some embodiments, and may serve as an ASIC substrate for subsequent formation of ASIC circuitry in act 104. It is desirable in at least some embodiments to electrically connect an ASIC substrate with one or more other substrates, such as a substrate having a MEMS device. The inventor has recognized and appreciated that including through silicon vias in the ASIC substrate allows low-cost wafer level packaging of high performance devices when such ASIC substrates are to be bonded with another substrate. Compared to individual die-based packaging approaches, wafer-level packaging affords a reduced overall packaging size, which in turn may provide for smaller end user devices than are achievable through single-die processing techniques. Through silicon vias may be used at wafer level in an ASIC substrate to electrically connect components from one surface of the silicon wafer to components at an opposed surface of the silicon wafer through the silicon wafer. The opposed surface of the silicon wafer may then be bonded to other wafers in a stacked fashion with electrical communication between the wafers being provided by the TSVs. TSVs provide high performance interconnects with low electrical resistance due to the short interconnect distance and high conductivity of the conductive material filling the via.

Formation of the TSV at act 102 may include forming a recess in the wafer. A width or diameter of the recess may be defined by the width or diameter of a pattern in a masking layer deposited on a surface of a wafer. Any suitable semiconductor manufacturing technique may be used for depositing and patterning the masking layer. In some embodiments, the pattern in the masking layer is an etch mask and a depth of the recess may be defined by an etching process through the patterned mask. Any suitable semiconductor manufacturing technique may be used for etch removal of the wafer material along the thickness direction of the wafer. Preferably, an anisotropic etching process is employed such that the etched recess has a substantially constant cross-sectional shape and/or dimension (width, diameter, or other dimension) along its length through the wafer. The depth of the recess may be controlled by the duration of the etch.

In some embodiments, subsequent to forming a recess in the wafer, act 102 in FIG. 1 further includes filling the recess with a conductive material to form a conductive portion of the TSV. The conductive filling material may be any conductive material compatible with semiconductor manufacturing processes, such as a material compatible with complementary metal oxide semiconductor (CMOS) fabrication techniques. For example, the conductive material used to fill the recess formed in the substrate may be metal, metal alloy, conductive ceramic compounds such as TiN, or doped semiconductor or semiconductor alloys. The conductive filling material may be deposited into the recess using any suitable deposition technique.

In one example, the filling material is doped silicon (e.g., polysilicon), deposited in the recess using sputtering, chemical vapor deposition (CVD), or any other suitable polysilicon deposition processes. According to aspects of the present application, depositing conductive polysilicon (or, more generally, silicon) as the filling material in the via allows formation of smaller via diameters compared to what can be achieved using other filling materials such as electroplated metal. TSVs with smaller diameter may allow higher density of components and interconnects within the same surface area on the wafer, leading to increased performance and/or lower cost. In some embodiments, the polysilicon deposition process may be a high temperature deposition process with at least one processing step with process temperature of more than 450° C., more than 550° C., more than 650° C., more than 750° C., between 450° C. and 1200° C., or any temperature or range of temperatures within such ranges. The polysilicon filling material may be doped p-type or n-type during the deposition process to increase electrical conductivity of the filling material. In some embodiments, the deposited doped polysilicon filling may be subject to a high temperature activation anneal process for activation of dopants to further enhance the electrical conductivity and improve electrical performance of the TSV interconnect. In some embodiments, the high temperature dopant activation anneal process may be a high temperature anneal with at least one processing step with process temperature of more than 550° C., more than 650° C., more than 750° C., more than 850° C., between 550° C. and 1200° C., or any temperature or range of temperatures within such ranges. The anneal may be performed at a temperature higher than that at which the deposition is performed.

According to some embodiments, forming a TSV in the wafer at act 102 may additionally include formation of an isolation liner material covering the interior of the formed recess, prior to deposition of the conductive filling material. The isolation liner may electrically isolate the conductive filling material from the surrounding wafer material. A sufficient thickness of the isolation liner material may be provided such that capacitive coupling between the conductive filling material and the wafer is reduced. In some embodiments, the isolation liner material is silicon oxide. In one example, the isolation liner silicon oxide is thermal growth silicon oxide (referred to herein simply as "thermal oxide"). In another example, the isolation liner silicon oxide is deposited using tetraethyl orthosilicate (TEOS).

It should be appreciated that at the end of act 102, circuitry components of the ASIC are not yet formed. In at least some such embodiments, no metal features of the ASIC are formed prior to completion of act 102.

At act 104, ASIC components are formed in the wafer. ASIC components may comprise a plurality of transistor components formed in the semiconductor wafer to perform application specific processing. The ASIC components may also comprise a plurality of conductive interconnects formed on a surface of the wafer as well as on layers deposited further on top of the surface of the wafer, to connect the plurality of transistor components. In some embodiments, forming the transistor components in the semiconductor wafer comprises patterning the semiconductor wafer to form transistor channels, doping one or more portions of the semiconductor wafer with dopants, and/or a high temperature dopant activation anneal process for activation of dopants in the transistors.

The components of the ASIC may be formed on a first surface of the wafer, which may be referred to as a device surface, front surface (or "front face), processing surface, or by other similar terminology. The opposing surface of the wafer, which may be referred to as the backside, back surface, rear surface, or by other similar terminology, may lack circuitry components. However, electrical connection, such as through the TSVs, may be provided on the backside of the wafer.

According to aspects of the present application, TSVs are formed in the ASIC substrate at act 102 prior to formation of the ASIC circuitry at act 104, including prior to any of the semiconductor and metal components of the ASIC circuitry being formed. The inventors have recognized that once ASIC components are formed in the ASIC substrate, it is undesirable to subject the wafer to high temperature processing steps with a high thermal budget to minimize development of stress between materials with different thermal expansion coefficients during thermal cycling as well as to prevent diffusion of material across the substrate at high temperatures. Thus, forming circuitry components of the ASIC prior to forming the TSV would preclude the use of materials for the TSV which are processed at temperatures above those at which the ASIC circuitry components are processed. Therefore, forming the TSVs first as described above with respect to act 102, before any ASIC component is formed on the wafer, allows the use of high temperature processes for deposition of conductive TSV filling material (e.g., doped polysilicon), post deposition dopant activation annealing of the conductive filling material, and for formation of the isolation liner material, while avoiding risks such as thermal stress and diffusion of materials in the ASIC circuitry.

Furthermore, forming the TSV in the wafer prior to forming any ASIC components may simplify the design of the ASIC interconnect scheme and allow signal routing close to or directly above the vias to increase aerial density of ASIC components within the same surface area on the ASIC substrate.

At act 106, the ASIC wafer is bonded to a MEMS wafer such that the ASIC circuitry in the ASIC wafer is in electrical communication with device components in the MEMS wafer. The MEMS wafer may comprise one or more MEMS sensors for detecting displacement and/or acceleration in one or more translational and rotational axes, as non-limiting examples. The present application is not limited to the particular type of MEMS device used. In some embodiments, the MEMS sensors may be an accelerometer, or a high performance gyroscopic sensor. The MEMS sensors may comprise one or more movable components. In some embodiments, the movable component comprises a suspended silicon membrane supported on one or more fixed portions by the MEMS wafer. The movable component also comprises one or more free moving portions, such as when the MEMS device is a resonator. In one example, the movable component comprises a silicon membrane resonator in a silicon on insulator (SOI) MEMS wafer.

In some embodiments, when the ASIC wafer is bonded with the MEMS wafer, the bond creates a hermetic seal around the MEMS device (e.g., around a MEMS resonator). The seal may be desirable to provide a vacuum or other pressure-controlled environment (e.g., an inert gas environment) in which the MEMS device operates. For this reason the cavity may be filled with inert gas or evacuated to a substantially low pressure level prior to being sealed. The inventors have recognized that the front side of the ASIC substrate comprising multiple ASIC components processed using a plurality of chemicals during semiconductor manufacturing may exhibit outgassing well after fabrication of the ASIC is complete. Such outgassing can negatively impact the controlled environment of the cavity formed between the ASIC wafer and the MEMS wafer. Thus, in at least some embodiments it is preferred that the back side of the ASIC wafer is used to bond to the MEMS wafer and to form a cavity with the MEMS device (e.g., resonator), to avoid contamination and/or pressure buildup of the cavity from outgassing of the ASIC components that may affect performance of the MEMS device. In some embodiments, the ASIC components face away from the bonded MEMS wafer and the TSVs allow the ASIC components at the front side of the ASIC wafer to electrically communicate with the back side, which is further connected to MEMS devices in the MEMS wafer via the bonds. That is, the front side of the ASIC wafer is distal the MEMS wafer, while the back side of the ASIC wafer is proximate the MEMS wafer.

Figure 2A:
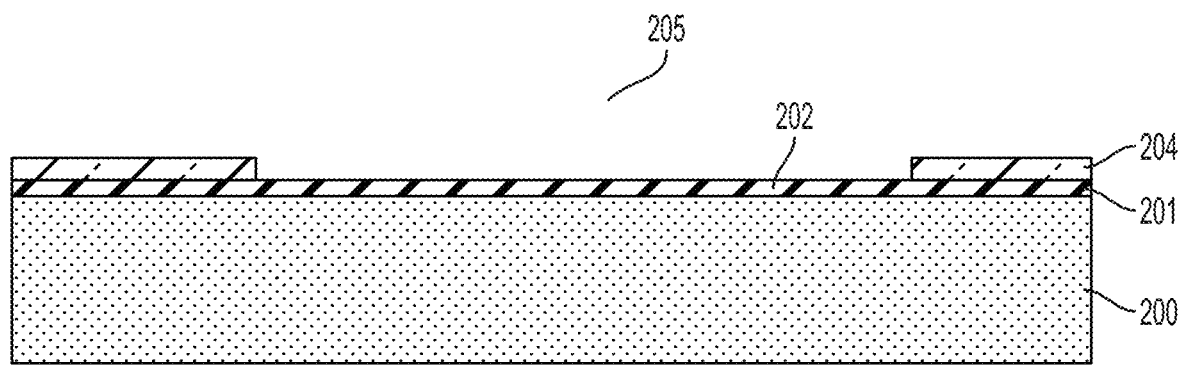
FIGS. 2A-2S illustrate, in cross-sectional views, a fabrication sequence for fabricating an ASIC wafer bonded with a MEMS wafer, where the ASIC wafer includes a through silicon via.
Figure 2B:
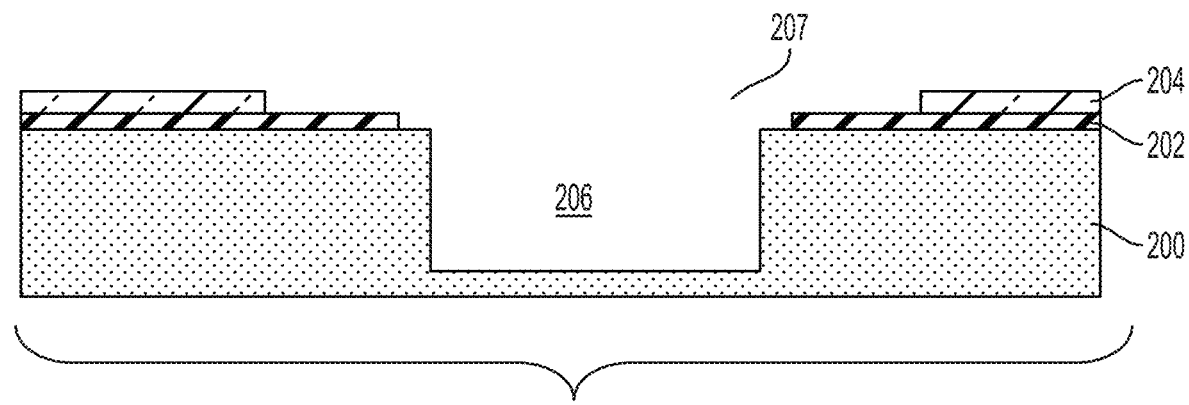
Figure 2C:
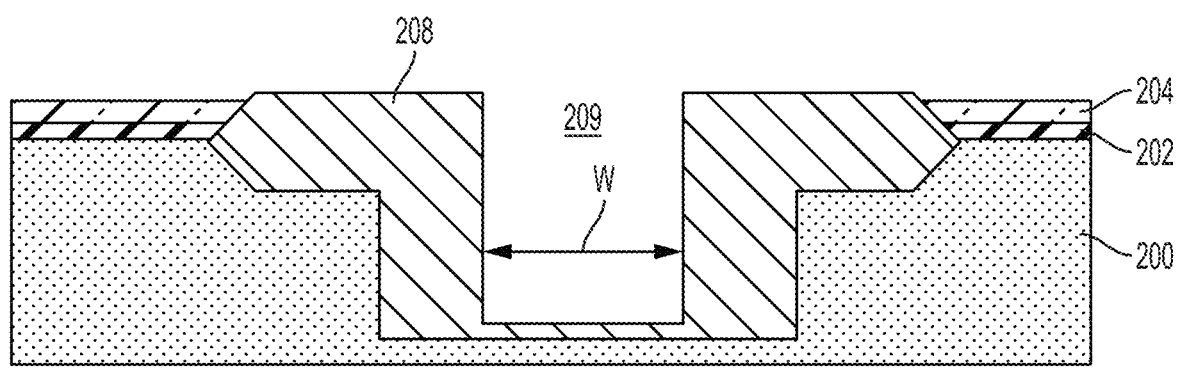
Figure 2D:
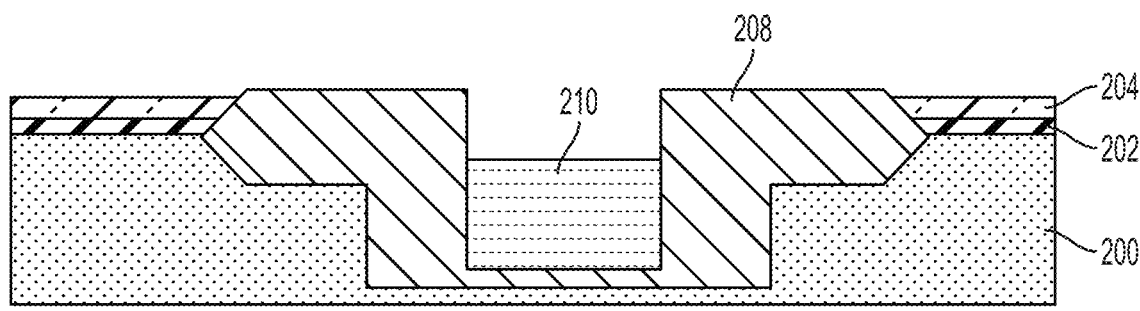
Figure 2E:
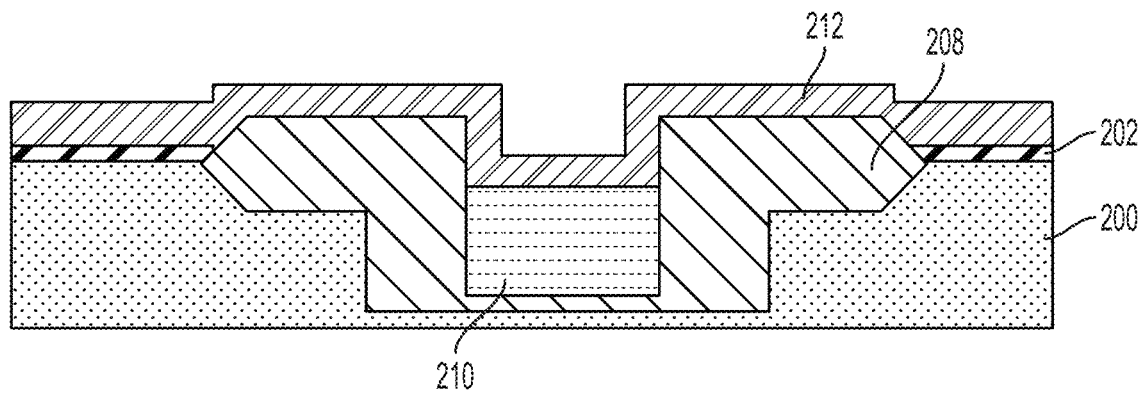
Figure 2F:
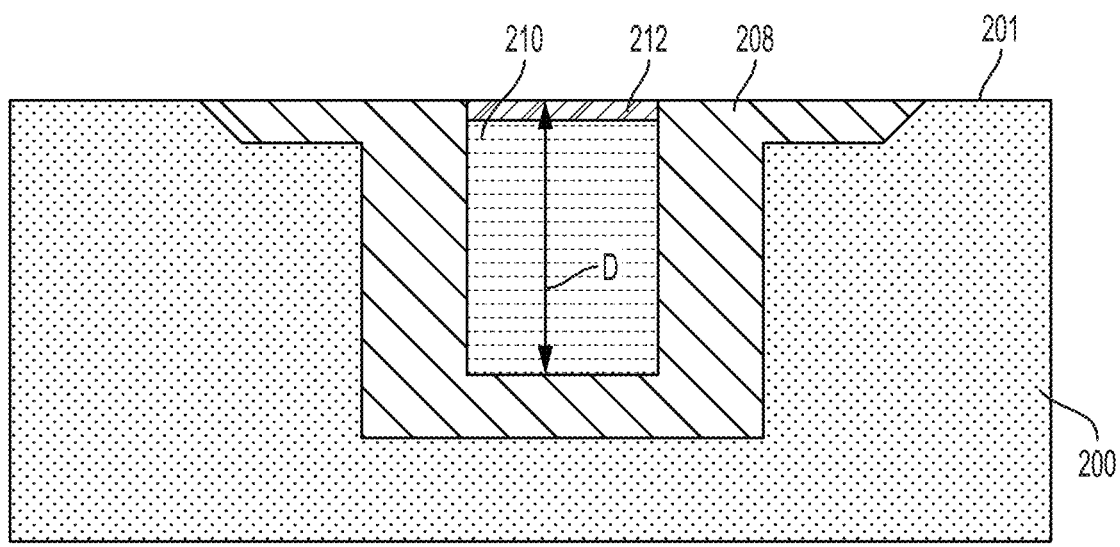
Figure 2G:
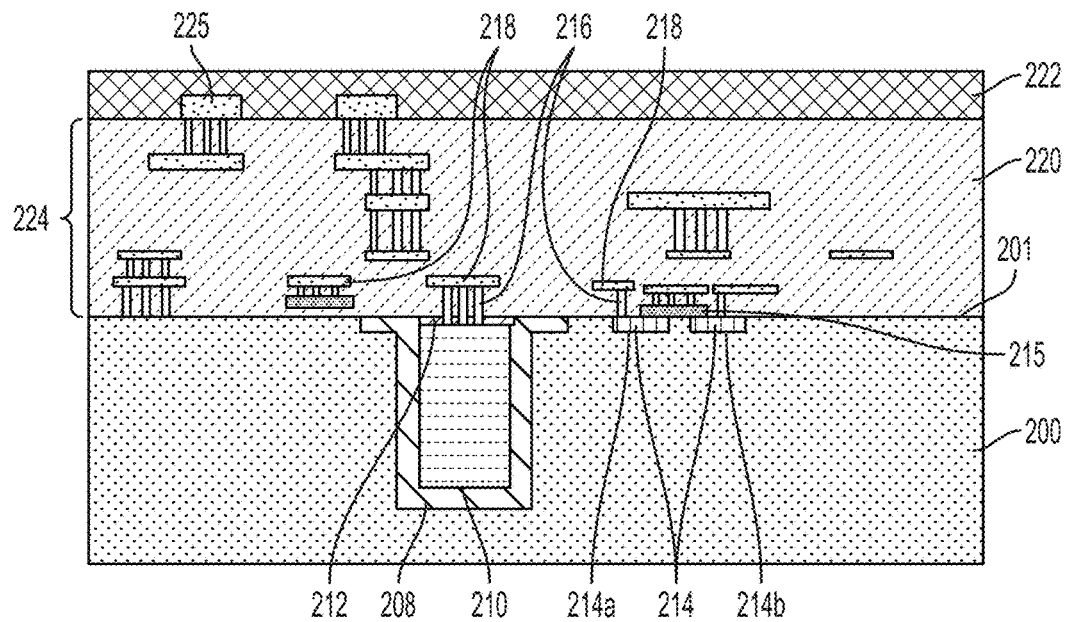
Figure 2H:
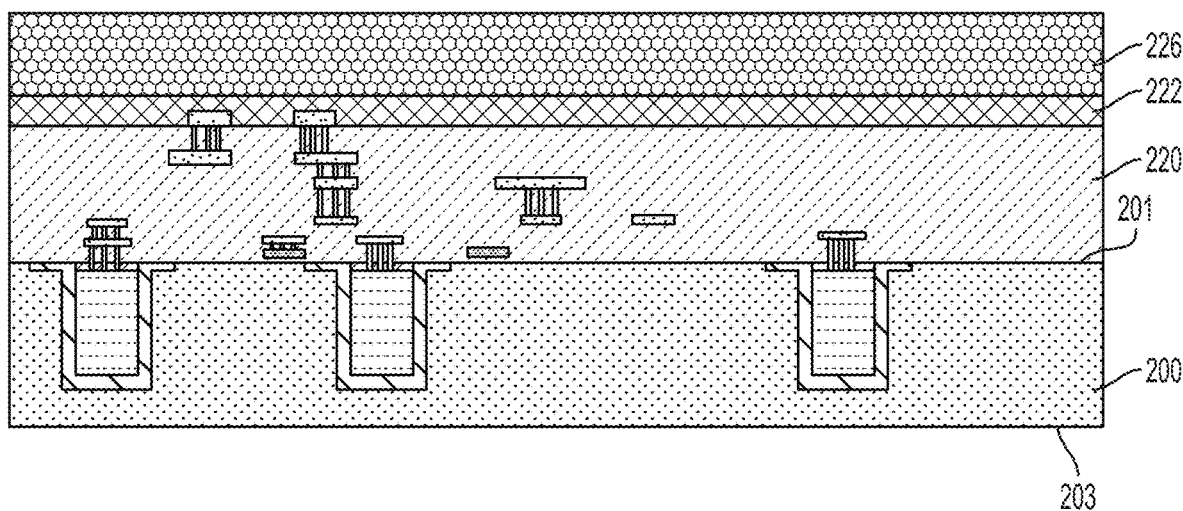
Figure 2I:
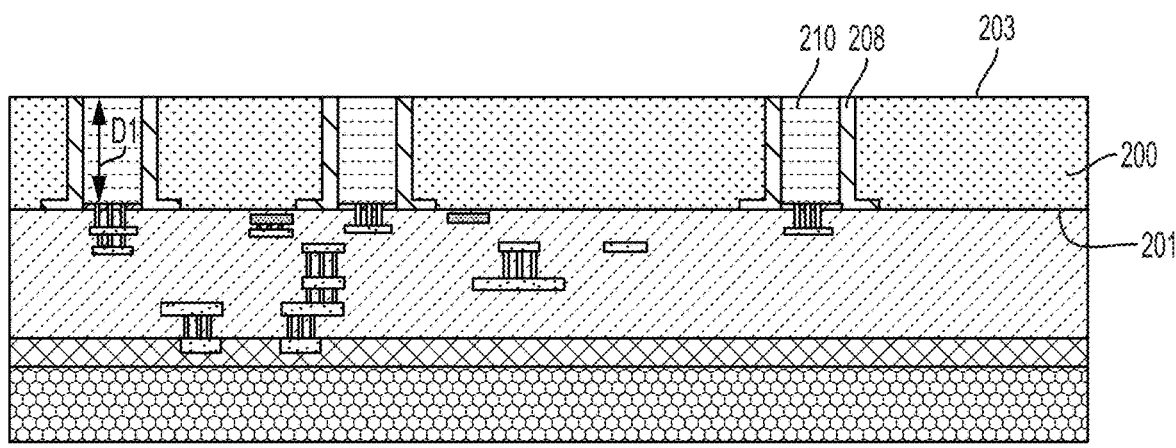
Figure 2J:
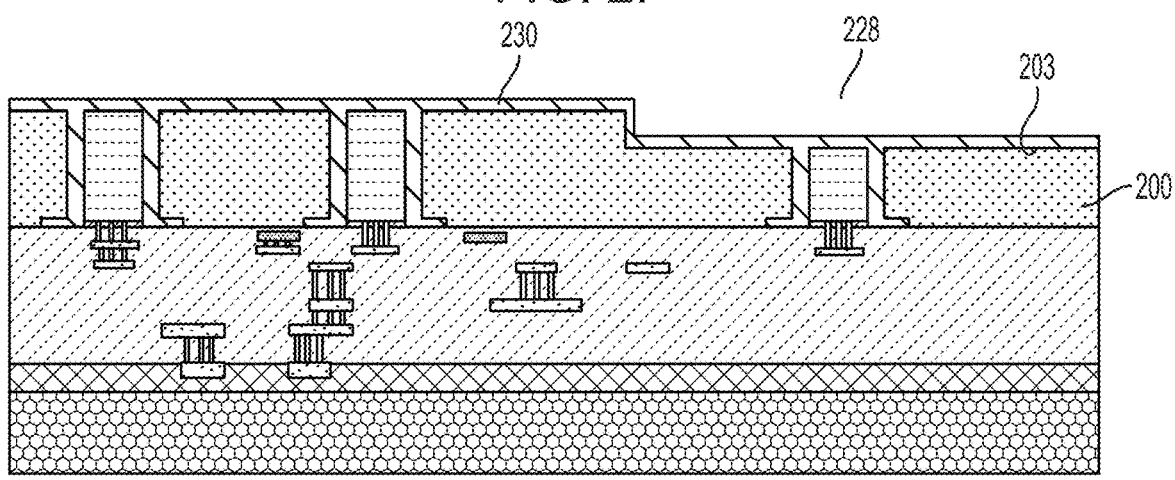
Figure 2K:
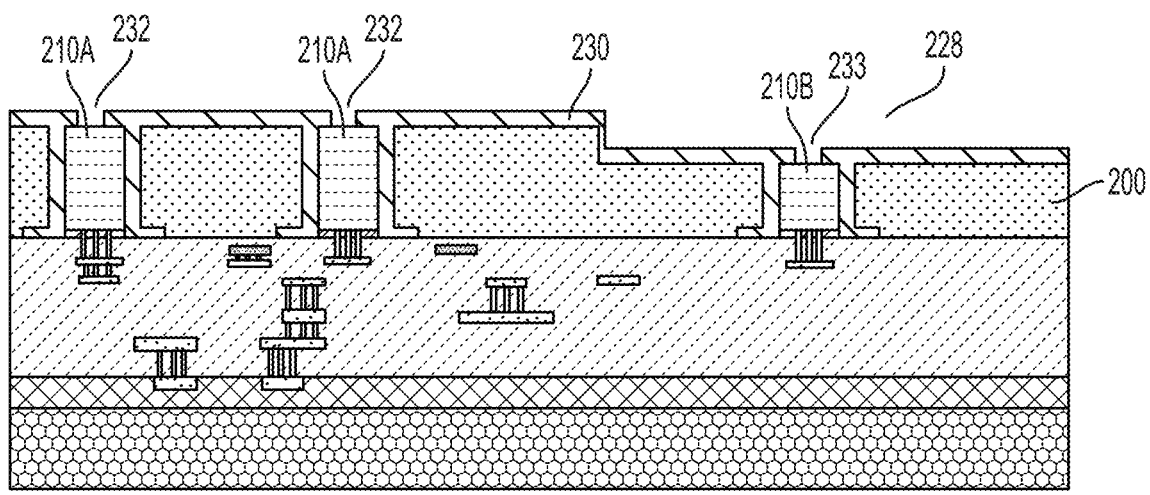
Figure 2L:
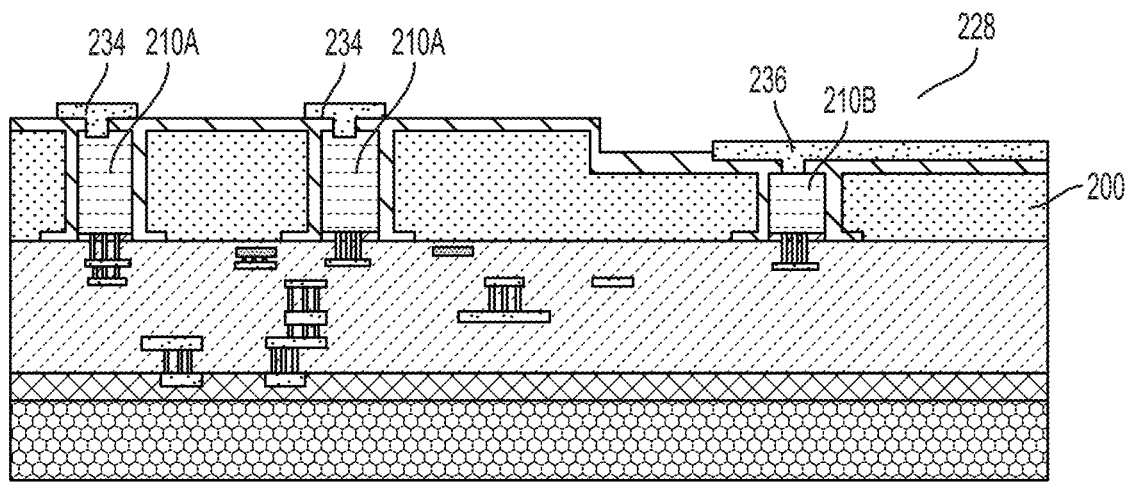
Figure 2M:
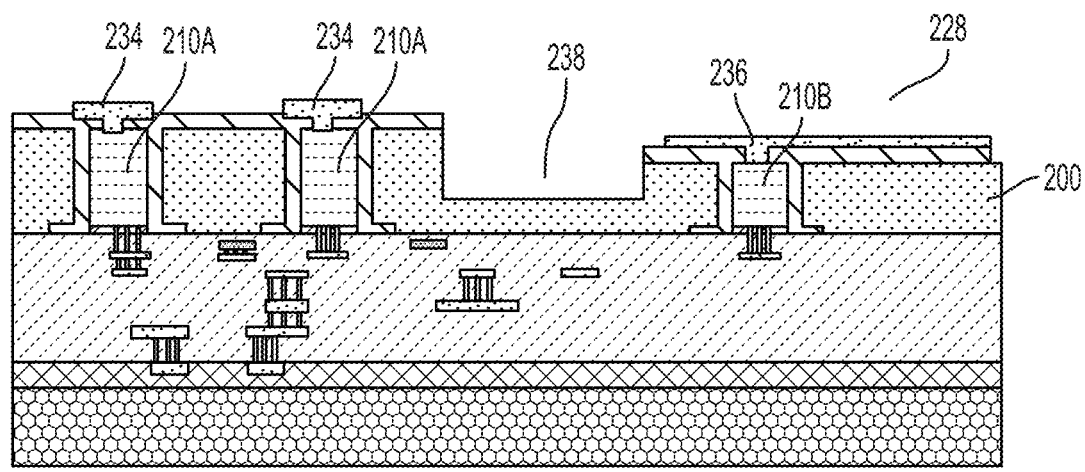
Figure 2N:
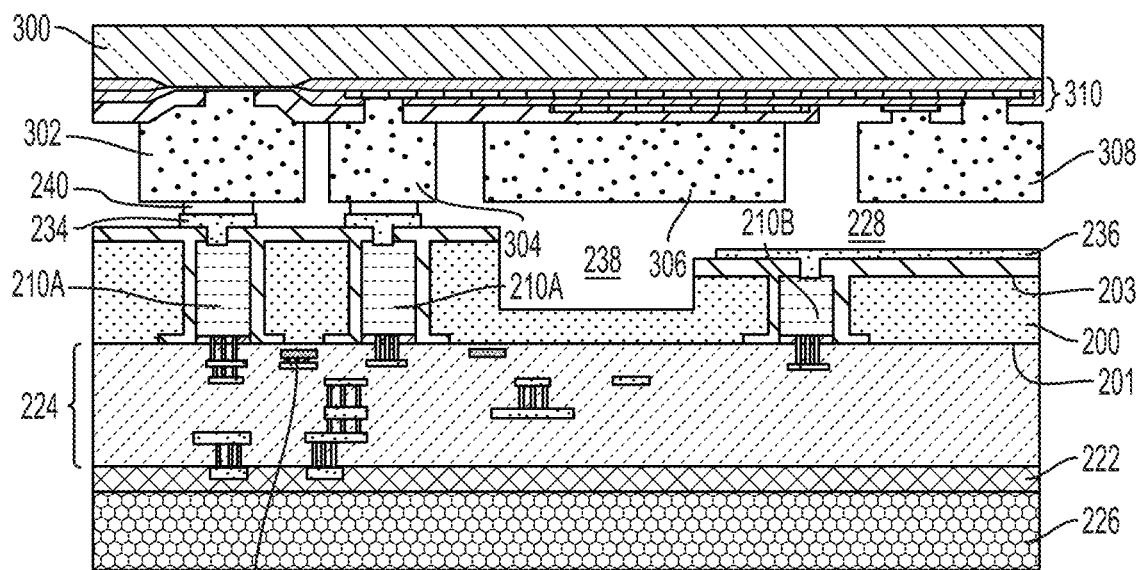
Figure 2O:
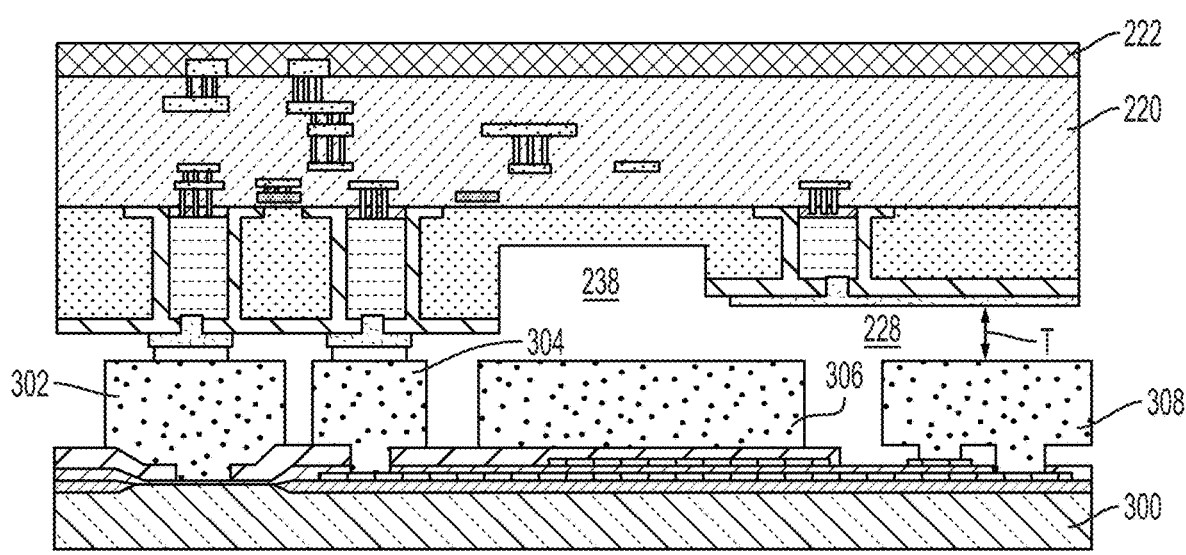
Figure 2P:
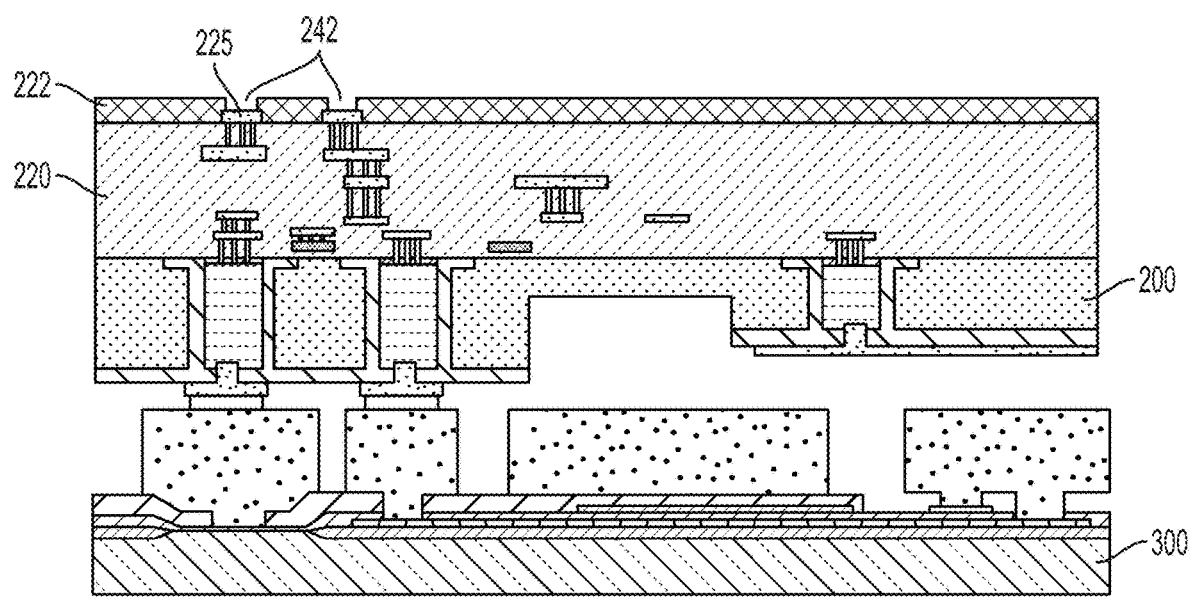
Figure 2Q:
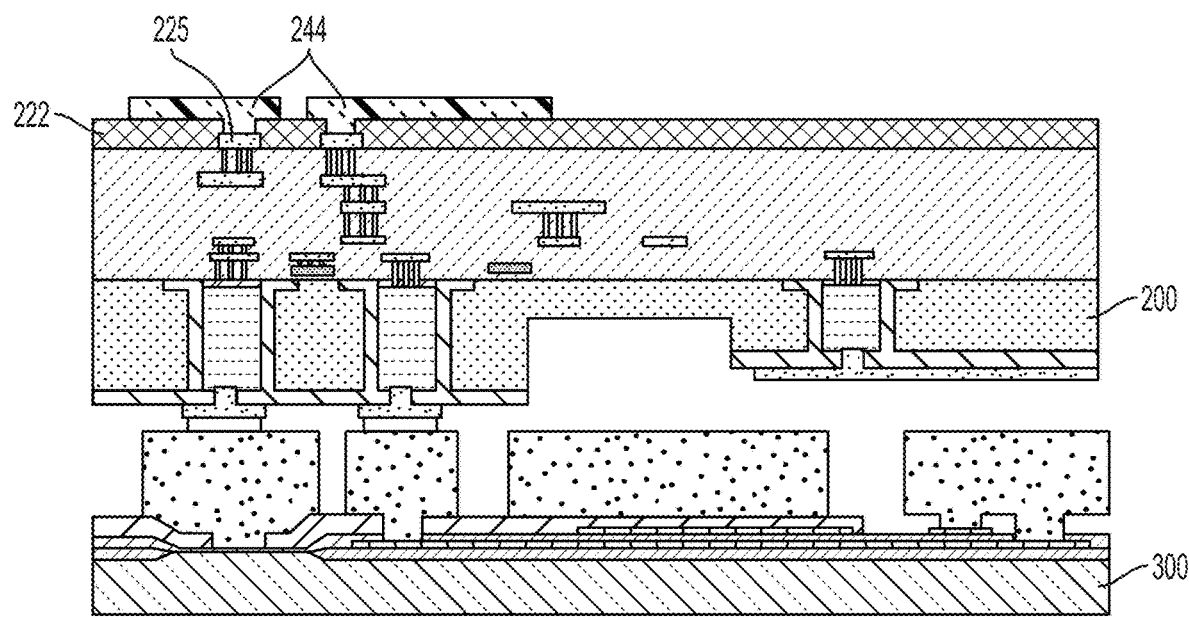
Figure 2R:
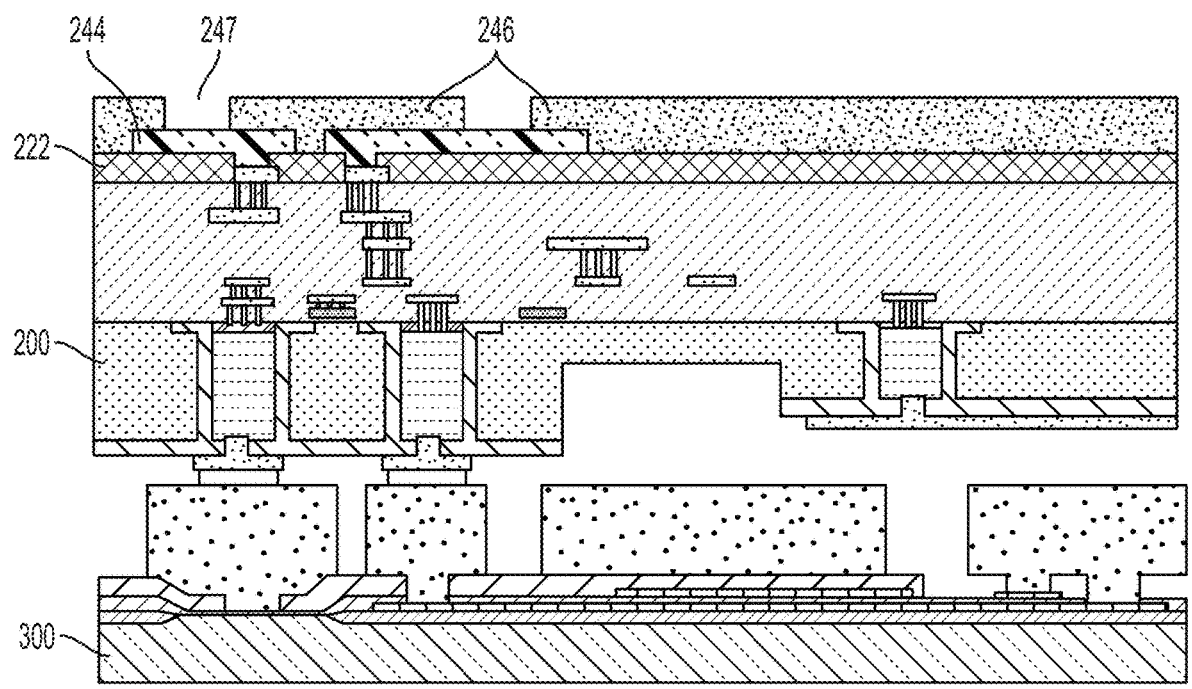
Figure 2S:
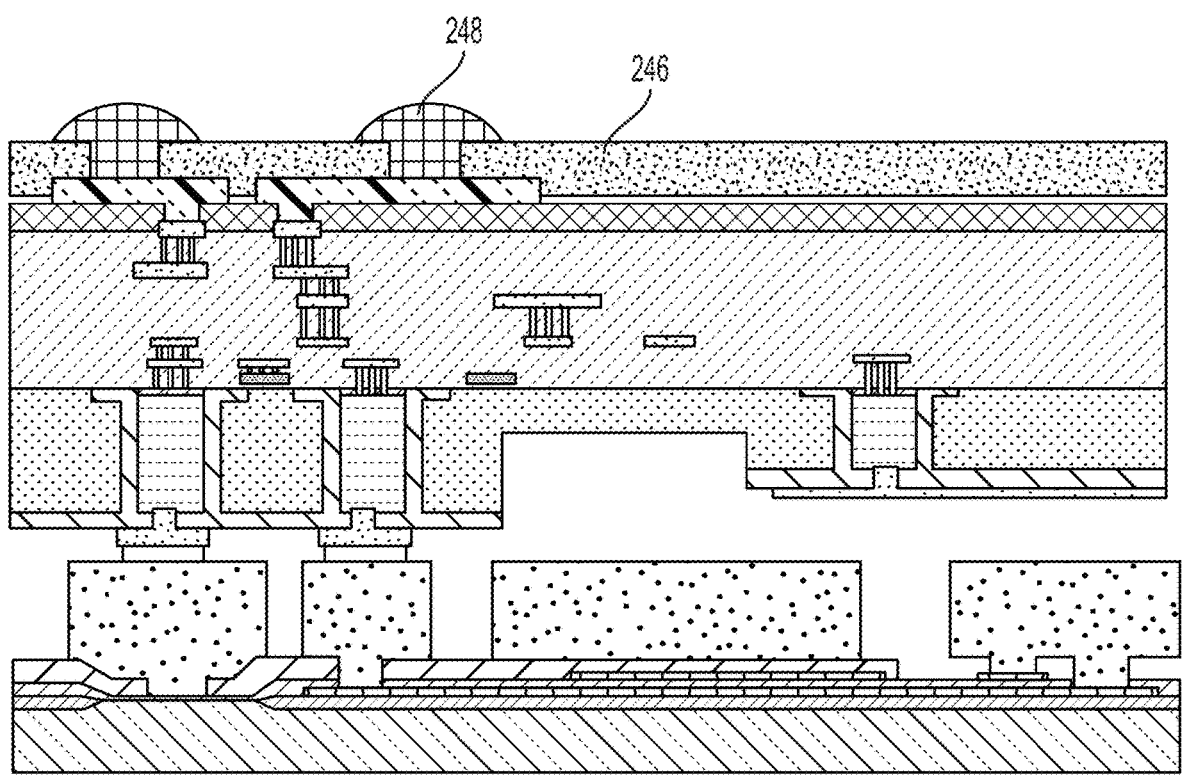

FIGS. 2A-2S illustrate, in cross-sectional views, a fabrication sequence for fabricating an ASIC wafer bonded with a MEMS wafer, consistent with the method 100 of FIG. 1.

FIGS. 2A-2F illustrate a sequence for fabricating a TSV in an ASIC wafer according to an embodiment of the present application, and represents an example implementation of act 102 of method 100.

As shown in FIG. 2A, a silicon oxide layer 202 is grown on the front side 201 of a silicon wafer 200. Subsequently, a layer of silicon nitride 204 is deposited and patterned with standard lithographical patterning and selective etching techniques to create an opening 205 in the silicon nitride 204 exposing the oxide layer 202. It should be appreciated that the cross-sectional view of wafer 200 shown in FIG. 2A, and any of FIGS. 2A-2F in the discussions below may show only a portion of the entire lateral extent of wafer 200 for illustrative purpose only. Similarly, the cross-sectional views of wafer 200 shown in FIGS. 2A-2E do not illustrate the full vertical extent of the wafer 200.

As shown in FIG. 2B, an opening 207 in silicon oxide layer 202 is created by lithography and etching. Oxide layer 202 with opening 207 serves as a via etch mask for removal of the silicon wafer underneath the opening 207, creating a recess 206. Recess 206 is created using a deep silicon etching process capable of etching to a desired depth for a through silicon vias, such as deep reactive ion etching (DRIE). In some embodiments, the silicon wafer 200 is etched to a depth of 50 microns, 200 microns, 300 microns, between 50 microns and 400 microns, or any depth or range of depths within such ranges. In some embodiments, the silicon wafer 200 is etched to a depth representing one-quarter of the thickness of the wafer, one-third of the thickness of the wafer, one-half of the thickness of the wafer, three-quarters of the thickness of the wafer, the entire thickness of the wafer, or any depth between one-quarter of the thickness of the wafer and the entire wafer thickness.

As shown in FIG. 2C, isolation oxide layer 208 is grown on the side walls of recess 206 and on the front side surface of wafer 200 within the opening 205 of the nitride mask 204. Oxide layer 208 is also grown at the bottom of recess 206 (not shown). In some embodiments, oxide layer 208 is grown by a dry or wet silicon oxidation process. During oxidation, the opening 205 of the nitride mask 204 serves as a mask to stop growth of oxide layer 208 on the front side surface of wafer 200 outside of the opening 205. In some embodiments, the oxide layer 208 is grown to a thickness of at least 1.6 µm (e.g., between 1 micron and 5 microns, or any value within that range) to provide direct electrical isolation and capacitive isolation between conductive materials inside the recess 206 and wafer 200. Alternatively, oxide layer 208 may be formed using any suitable oxide deposition techniques, such as TEOS.

Still referring to FIG. 2C, the via recess 209 has a diameter or width W that is smaller than that of the recess 206 due to the growth of oxide layer 208 on the side wall of recess 206. In some embodiments, the width W is between 5 and 10 µm, between 5 and 20 µm, between 10 and 20 µm, or any other suitable value. In at least some embodiments, the width W is less than the depth of the recess 209. The through silicon via ultimately formed through the process of FIGS. 2A-2F may be a high aspect ratio via, having a greater depth than width. Some example aspect ratios include 5:1, 10:1, 20:1, greater than 20:1, between 10:1 and 20:1, or any value or range of values within such ranges.

As shown in FIG. 2D, filling 210 (e.g., polysilicon) is deposited inside the via recess 209 as conductive filling material that will form the conductive portion of the TSV. The polysilicon deposition process may be a high temperature deposition process with at least one processing step having a temperature of more than 450° C., more than 550° C., more than 650° C., more than 750° C., between 450° C. and 1200° C., or any value within such ranges. The polysilicon filling material may be doped p-type or n-type during the deposition process to increase electrical conductivity of the filling material. In some embodiments, the deposited, doped polysilicon filling may be subject to a high temperature activation anneal process for activation of dopants to further enhance the electrical conductivity and improve electrical performance of the TSV interconnect. In some embodiments, the high temperature dopant activation anneal process may be a high temperature anneal with at least one processing step with a temperature of more than 550° C., more than 650° C., more than 750° C., more than 850° C., between 550° C. and 1200° C., or any value within such ranges. The anneal may be performed at a temperature higher than that at which the deposition is performed.

At this stage, a silicon CMP may optionally be performed. Alternatively, a blanket silicon etch back step may be performed to remove polysilicon from the surface of the nitride mask 204. In one embodiment, both a CMP and a silicon etch back step are performed. However, alternatives are possible.

As shown in FIG. 2E, nitride mask layer 204 is stripped by, for example, a hot phosphorous etch. A passivation layer 212 is deposited over the entire wafer surface, covering the top surfaces, exposed openings and side walls in the via recess. In some embodiments, the passivation layer 212 is formed of silicon oxide deposited using TEOS.

As shown in FIG. 2F, a polishing step is performed to planarize the top of the structure in FIG. 2E such that the top surface of isolation oxide layer 208 and passivation layer 212 is substantially co-planar (or flush) with the front side 201 of wafer 200. In some embodiments, the planarization is performed using chemical mechanical polishing (CMP). For example, an oxide CMP step may be performed to planarize the surface of the structure, stopping on the oxide layer 202. A hydrofluoric (HF) acid dip may then be used to strip the oxide layer 202. As shown in FIG. 2F, a depth D of the TSV is defined as the distance between the isolation oxide layer 208 lining the bottom of recess 206 and the front side 201 of the wafer 200.

The fabrication of FIGS. 2A to 2F may be performed on silicon wafer 200 while there are no ASIC components on the wafer, including semiconductor transistor channels and conductive interconnects. In other words, at FIG. 2F, TSVs with diameter W and depth D and with conductive portions comprising filling 210 (e.g., doped polysilicon) are formed in wafer 200, before any ASIC components are formed. As a result, thermal stresses and diffusion of the ASIC components during the high temperature processing steps used to form the TSV are avoided in at least some embodiments. The wafer 200 with TSVs as shown in FIG. 2F may subsequently be processed to form ASIC components and become an ASIC substrate, as shown in the following figures. It should be appreciated that for simplicity the term "ASIC substrate" and similar terminology are used to describe a substrate in which an ASIC is or will be formed, even prior to formation of the ASIC.

FIGS. 2G-2M illustrate a sequence for forming ASIC components in the wafer 200, and thus represent an example implementation of act 104 of method 100.

As shown in FIG. 2G, standard semiconductor manufacturing may be used to form a plurality of semiconductor transistors 214 at the front side 201 of the silicon wafer 200. In some embodiments, transistors 214 may comprise a source portion 214a and a drain portion 214b, with a suitable doping type and level. Transistors 214 are electrically connected to a plurality of conductive interconnects 218 via vertical interconnects 216. Transistors 214 may additionally comprise gate portions 215 for controlling electric current flow between the source and drain portions 214a, 214b of the transistor channel. Gate 215 is also electrically connected to interconnects 218 via vertical interconnects 216. The interconnects 216, 218 are formed above the surface of silicon wafer 200 and are embedded in and supported by dielectric layer 220 using any suitable semiconductor processing technique(s). In some embodiments, the interconnects 216 and 218 are the first layer of a plurality of metal interconnect layers 224 used to route electric signals between various ASIC components such as transistors 214 at different locations on the surface of wafer 200. In the non-limiting example illustrated, a top layer of metal interconnects 225 is further embedded in dielectric passivation layer 222.

As shown in FIG. 2G, the ASIC components are electrically connected to the filling 210 of the TSV with vertical interconnects 216. This connection allows the ASIC components to communicate electrically with components at the back side 203 (labeled in FIG. 2H) of the silicon wafer 200 through the filling 210 of the TSV. In some embodiments, openings in passivation layer 212 are formed to allow vertical interconnects 216 to come into contact with top of the filling 210. In some embodiments, any suitable planarization technique, such as chemical mechanical polishing, may be used to planarize a layer prior to fabrication of additional layers above.

As shown in FIG. 2H, a carrier substrate 226 may be temporarily bonded to the top of the structure shown in FIG. 2G. The use of the carrier substrate may provide mechanical support for the wafer 200, allowing the back side 203 of wafer 200 may be further processed. In some embodiments, the carrier substrate 226 may be a handle wafer.

FIG. 2I illustrates the result of processing on the back side 203 of wafer 200. The structure shown in FIG. 2I is flipped upside down relative to the orientation of the structure shown in FIG. 2H. As shown in FIG. 2I, a grinding and planarization step may be performed to remove material(s) at the back side 203 of the wafer 200 such that filling 210 of the TSV is exposed flush with the back side 203. Any suitable etching and planarization technique may be used.

The depth of the etched via D1 is defined after grinding of the back side 203. In some embodiments, the TSV depth D1 may be between 100 µm and 200 µm, or between 100 µm and 150 µm, or between 50 µm and 100 µm. In some embodiments, the aspect ratio of a TSV or the ratio between the TSV depth D1 and width W may be 5:1, or 10:1, or 20:1, greater than 20:1, between 10:1 and 20:1, or any value or range of values within such ranges.

As shown in FIG. 2J, a portion of the back side 203 of the wafer 200 may be further etched to create cavity recess 228. A passivation layer 230 may be deposited on the back side 203 covering the entire exposed surface. In some embodiments, passivation layer 230 may be silicon oxide and may be deposited using any suitable oxide deposition techniques.

As shown in FIG. 2K, openings 232 are patterned and etched in passivation layer 230 to expose portions of TSV filling 210A. Openings 233 are patterned and etched in passivation layer 230 to expose portions of conductive TSV filling 210B for TSVs underneath the cavity recess 228. As will be discussed in more detail below, conductive fillings 210A and 210B are of the same conductive material as filling 210. Conducting filling 210A and 210B may serve as conductors connecting ASIC components in the wafer 200 with electrodes that may serve different functions.

In FIG. 2L, conductive contacts 234 are deposited and patterned on top of openings 232 to provide electrical connection with the conductive TSV filling 210A. The TSV comprising conductive TSV filling 210A connects ASIC components in the wafer 200 with electrodes 234 on the back side 203 of wafer 200. Conductive contacts 236 are deposited and patterned on top of openings 233 to provide electrical connection with the conductive TSV filling 210B underneath the cavity recess 228. In some embodiments, contact electrode 236 may be used to provide an electrical field or electrical biasing across the cavity recess 228 to MEMS elements at an opposing surface of the cavity.

As shown in FIG. 2M, a cavity 238 may be patterned and etched in the ASIC substrate 200 to provide a larger cavity outside the active MEMS region.

FIGS. 2N-2S illustrate a fabrication sequence for bonding an ASIC wafer with a MEMS wafer, and thus represent an example implementation of act 106 of method 100. Here, the wafer 200, which is an ASIC wafer, is bonded with a MEMS wafer 300.

As shown in FIG. 2N, a MEMS wafer 300 may be bonded with components on the back side of the wafer 200 via a series of bonds 240. In the example in FIG. 2N, the front side 310 of the MEMS wafer 300 comprises a plurality of conductive and dielectric layers with conductive members 302, 304, 306 and 308 that connect to various components in the front side 310. In some embodiments, conductive members 302, 304, 306 and/or 308 may connect with interconnect layers on the MEMS wafer 300. In some embodiments, the MEMS wafer 300 may comprise MEMS sensor elements that provide acceleration and/or displacement signals for applications as inertial sensors, gyroscopic sensors, or other forms of inertial sensor. However, the type of MEMS device included on MEMS wafer 300 is not limiting of the various aspects described herein, as a variety of MEMS devices may be implemented. When bonded with wafer 200, electrical connections may be made between the MEMS sensor elements in the MEMS wafer 300 and the ASIC circuitry in the wafer 200, for communication of the sensor data and/or control signals between the MEMS sensor(s) and the ASIC as well as to provide signal processing for the communicated sensor data.

As shown in FIG. 2N, conductive members 302 and 304 of the MEMS wafer 300 may be aligned with and bonded to corresponding electrodes 234 on the back side of the ASIC substrate. In some embodiments, the bond may be a metal eutectic bond using bonding metal or metal alloys 240. In some embodiments, bonding the MEMS wafer 300 with the wafer 200 may define the two opposing surfaces of cavity 228 with the electrode 236 on the back side 203 of wafer 200 and the conductive member 308 on the front side of MEMS wafer 300. A cavity 238, which may be deep in at least some embodiments, may also be defined with the conductive member 306 opposing a surface of wafer 200 where cavity 238 is located. In some embodiments, conductive member 308 may comprise a suspended moving portion supported on one or more fixed anchors on the MEMS wafer 300. The moving portion of conductive member 308 may have a displacement along an axis normal to the surfaces of the MEMS wafer 300 and the ASIC substrate 200.

In some embodiments, a conductive member on the MEMS wafer 300 such as member 304 may form a seal ring (not shown) when bonded with the wafer 200, completely encircling the cavities. Although a seal ring is provided as an example, the conductive member 304 may be any shape when viewed from a top view along an axis normal to the MEMS wafer and any suitable geometry for the seal may be formed. The sealed cavities 238 and 228 may comprise low gas pressure and/or inert gas to prevent negative effects from gas reactants and contaminants on the MEMS sensor performance. In some embodiments, by placing the ASIC components such as transistors 214 and metal interconnect layers 224 on the front side 201 of the wafer 200 facing away from the MEMS wafer 300, the pressure in cavities 238 and 228 may be preserved and not affected by outgassing from the ASIC components. Thus, a low pressure in the cavity may be maintained over a long duration. Accordingly, the performance of the MEMS sensor device may be maintained with relatively small or no drift over a long period of time without the negative effects of outgassing from the ASIC components.

FIG. 2O illustrates the structure of FIG. 2N in a reversed orientation (upside down, or flipped around the horizontal axis), and after the carrier substrate 226 is removed. The carrier substrate 226 may be removed using any suitable wafer removal technique.

As shown in FIG. 2P, openings 242 may be formed in the dielectric passivation layer 222 to expose portions of metal interconnects 225. Any suitable patterning and etching techniques may be used to create the opening 242 and remove any masking layer.

As shown in FIG. 2Q, metal redistribution layer 244 may be deposited and patterned on top of the dielectric passivation layer 222 and in contact with the exposed metal interconnect 225.

As shown in FIG. 2R, a solder mask layer 246 is deposited on top of the metal redistribution layer 244 and the dielectric passivation layer 222. The solder mask layer 246 may be patterned by any suitable patterning and etching technique to form openings 247 to expose portions of the metal redistribution layer 244. Solder mask layer 246 may be any suitable protective material to protect electrodes and traces such as the metal redistribution layer 244 from unintended shorting during soldering. In some embodiments, solder mask layer 246 may comprise a polymer material.

As shown in FIG. 2S, solder balls 248 may be formed in the openings 247 in the solder mask layer 246. The completed package according to the exemplary embodiment in FIGS. 2A-2S may comprise a high number of individual dies containing MEMS sensor devices and corresponding ASIC circuitry on an ASIC wafer bonded with a MEMS wafer, and optionally with hermetic metal seals. In some embodiments, only one bonding step is performed to bond all the dies on the ASIC wafer with the MEMS wafer. The bonding step can seal and protect the MEMS sensor and ASIC substrate from outside environmental contaminants while making high performance interconnects between the MEMS sensor components and the ASIC circuitry using the TSVs in the ASIC wafer. The bonded wafers may be tested using a wafer probe at wafer scale with high throughput and efficiency prior to dicing and individual die sales, which eliminates many expensive assembly steps and materials associated with packaging and testing individual dies.

It should be appreciated that the result of the fabrication sequence shown in FIGS. 2A-2S is a capped MEMS device, in which the cap comprises an ASIC substrate. The circuitry components of the ASIC face away from the MEMS substrate, and are connected to the MEMS device by TSVs in the ASIC substrate which were formed prior to formation of the ASIC.

The fabrication techniques described in connection with FIGS. 1 and 2A-2S allow for formation of a TSV in an ASIC substrate prior to formation of the ASIC components. In at least some embodiments, fabrication of the TSV involves materials compatible with CMOS front end processing. Thus, the described methods may be performed in a suitable CMOS foundry.

Figure 3:
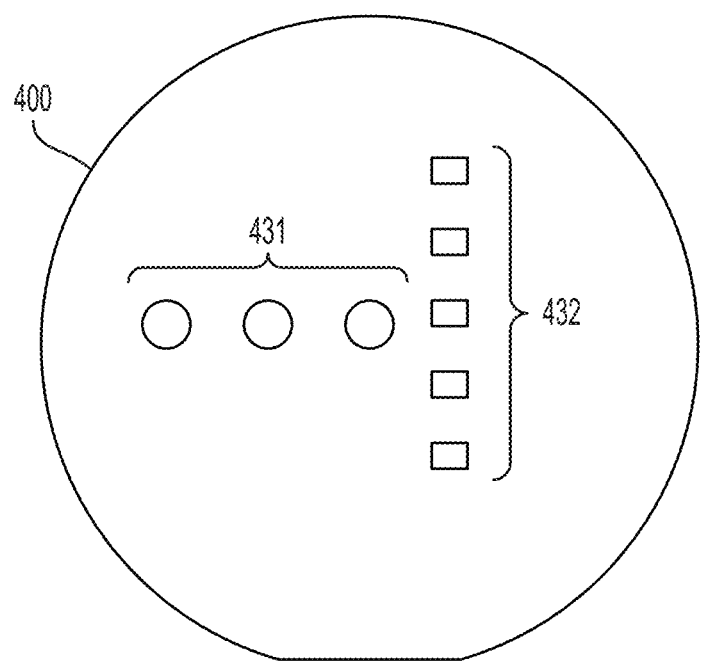
FIG. 3 illustrates, in top view, an exemplary silicon wafer with multiple through silicon vias formed therein.

FIG. 3 shows a schematic top view of an ASIC wafer 400 after formation of a plurality of TSVs 431 and 432. As shown in the example in FIG. 3, the TSVs may be fabricated in wafer 400 in any suitable location to form interconnects between ASIC components laterally adjacent the TSVs and the conductive components on the wafer containing MEMS device to be bonded to the ASIC wafer. In some embodiments, the TSVs may be arranged in one or more arrays extending in both orthogonal directions in two dimensions, though it should be appreciated that any suitable pattern, dimension, shape, or conductive filling materials may be used in TSV 431 and 432. Although not shown explicitly, each of the vias shown in TSVs 431 and 432 may include both a recess in wafer 400 and a conductive filling inside the recess. Each recess with corresponding filling may be collectively referred to as one via. According to an aspect of the present application, multiple wafers such as wafer 400 may be processed with TSVs on predesignated locations on the surface of the wafers using substantially the same process as described above in connection with the exemplary diagrams in FIGS. 2A-2S. Multiple wafers may be processed sequentially, substantially in parallel, or both during manufacturing. The illustrated TSVs may correspond to different dies, such that processing at the wafer level may provide for multiple dies at the same time. Bonding the ASIC wafer 300 to a complementary MEMS wafer may thus provide multiple capped MEMS devices which can be singulated. Such wafer-scale processing allows low-cost wafer level chip-scale packaging of high performance devices such as ASIC substrates bonded with MEMS substrates.

Aspects of the present application may be used to form a variety of devices for a variety of end user applications. For example, as described, aspects of the present application provide ASIC substrates bonded with MEMS substrates. The ASIC substrate may serve as a cap for the MEMS substrate, including circuitry for interacting with the MEMS device on the MEMS substrate. The MEMS device may be a gyroscope, pressure sensor, accelerometer, resonator, or other type of MEMS device. Thus, capped MEMS gyroscopes, pressure sensors, accelerometers, and resonators may be provided, among other possible devices.

The devices described above may be used in a variety of applications. For example, sensors for health care monitoring, industrial applications, and automotive applications may be provided. According to an embodiment of the present application, a capped MEMS accelerometer formed using the techniques described herein may be used in a vehicle to sense acceleration of the vehicle. In another embodiment, a capped MEMS energy harvester may be used on industrial machinery (e.g., a motor) to harvest energy from the ambient environment. The harvested energy may be used to power circuitry for controlling operation of the machinery.

Having described several aspects of at least one embodiment of the present application, it is to be appreciated that various alterations, modifications, and improvements will readily occur to those skilled in the art. For example, circuitry and through-wafer vias may be fabricated in any suitable substrate, such as a III-V substrate. Although embodiments using ASICs bonded to a MEMS wafer for MEMS sensor applications are discussed, application of the present disclosure is not limited to MEMS sensor devices. For example, aspects of the present application may be applied to photonic integrated circuits (PIC), environmental or biomedical sensors, or any application using heterogeneously integrated substrates.

The terms "approximately" and "about" may be used to mean within ±20% of a target value in some embodiments, within ±10% of a target value in some embodiments, within ±5% of a target value in some embodiments, and yet within ±2% of a target value in some embodiments. The terms "approximately" and "about" may include the target value.

What is claimed is:

1. An apparatus, comprising:
a microelectromechanical systems (MEMS) substrate including a MEMS device; and
an application specific integrated circuit (ASIC) substrate having a device surface, a backside opposite the device surface, an ASIC on the device surface, an electrode on the backside, and a through silicon via (TSV) formed of conductive polysilicon and connecting the device surface to the electrode on the backside,
wherein the MEMS substrate and ASIC substrate are bonded at the backside of the ASIC substrate such that the device surface is distal the MEMS substrate, the MEMS substrate and ASIC substrate define a sealed cavity between them, the TSV is separated from the MEMS substrate by the sealed cavity, and the electrode is positioned directly opposite the MEMS device across the sealed cavity.

2. The apparatus of claim 1, wherein the TSV has an aspect ratio between 12:1 and 30:1.

3. The apparatus of claim 1, wherein the MEMS device is disposed in the sealed cavity.

4. The apparatus of claim 3, wherein the MEMS device is an inertial sensor.

5. The apparatus of claim 1, wherein the MEMS substrate is a MEMS wafer having multiple instances of the MEMS device, wherein the ASIC substrate is an ASIC wafer having multiple instances of the ASIC, and wherein the MEMS wafer and ASIC are bonded together.

6. The apparatus of claim 1, wherein the TSV is connected to electrical circuitry on the MEMS substrate.

7. The apparatus of claim 1, wherein the MEMS device is an inertial sensor.

8. A method of forming a device including an application specific integrated circuit (ASIC), the method comprising:
- forming a through silicon via (TSV) in a substrate prior to forming any metal features on the substrate; and
- subsequent to forming the TSV in the substrate, forming ASIC components in a device surface of the substrate and forming an electrode on a backside of the substrate that is opposite the device surface, such that the TSV connects the device surface to the electrode,
- subsequent to forming ASIC components, bonding the substrate comprising the TSV with a substrate comprising a MEMS device to define a sealed cavity between them, and such that the device surface faces away from the substrate comprising the MEMS device, and the electrode is positioned directly opposite the MEMS device across the sealed cavity, wherein
- the TSV is separated from the substrate comprising the MEMS device by the sealed cavity.

9. The method of claim 8, wherein forming the TSV in the substrate involves forming the TSV in the substrate prior to forming any of the ASIC components in the device surface of the substrate.

10. The method of claim 8, wherein forming the TSV in the substrate comprises forming a conductive path through at least part of the substrate.

11. The method of claim 8, wherein forming the TSV in the substrate comprises forming the TSV of conductive polysilicon.

12. The method of claim 8, wherein forming the TSV in the substrate comprises forming a conductive portion of the TSV at a first temperature, and wherein forming the ASIC components in the device surface is performed at a second temperature lower than the first temperature.

13. The method of claim 12, wherein forming the conductive portion of the TSV at a first temperature comprises performing an anneal of the TSV at the first temperature.

14. The method of claim 8, wherein the MEMS device is disposed in the sealed cavity.

15. A method of forming a device including an application specific integrated circuit, the method comprising:
- forming a through silicon via (TSV) in a substrate using at least one processing step at a first temperature greater than 450° C.;
- forming transistors of the application specific integrated circuit using temperatures less than the first temperature at a device surface of the substrate comprising the TSV;
- forming an electrode on a backside of the substrate opposite the device surface, such that the TSV connects the device surface to the electrode; and
- bonding the substrate comprising the TSV to a substrate comprising a microelectromechanical systems (MEMS) device to define a sealed cavity, such that the device surface of the substrate comprising the TSV faces away from the substrate comprising the MEMS device, and the electrode is positioned directly opposite the MEMS device across the sealed cavity, wherein
- the TSV is separated from the substrate comprising the MEMS device by the sealed cavity.

16. The method of claim 15, wherein forming the through silicon via comprises forming a doped polysilicon TSV.

17. The method of claim 15, wherein the at least one processing step comprises an anneal.

18. The method of claim 15, wherein the MEMS device is disposed in the sealed cavity.

* * * * *